US012261141B2

(12) United States Patent
Jain

(10) Patent No.: US 12,261,141 B2
(45) Date of Patent: Mar. 25, 2025

(54) IC DEVICE WITH CHIP TO PACKAGE INTERCONNECTS FROM A COPPER METAL INTERCONNECT LEVEL

(71) Applicant: Texas Instruments Incorporated, Dallas, TX (US)

(72) Inventor: Manoj Kumar Jain, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/331,921

(22) Filed: May 27, 2021

(65) Prior Publication Data

US 2021/0375816 A1 Dec. 2, 2021

Related U.S. Application Data

(60) Provisional application No. 63/033,247, filed on Jun. 2, 2020.

(51) Int. Cl.

*H01L 21/768* (2006.01)
*H01L 21/56* (2006.01)

(Continued)

(52) U.S. Cl.

CPC ............ *H01L 24/20* (2013.01); *H01L 21/565* (2013.01); *H01L 21/76877* (2013.01); *H01L 23/53228* (2013.01); *H01L 24/11* (2013.01); *H01L 24/13* (2013.01); *H01L 24/19* (2013.01); *H01L 24/82* (2013.01); *H01L 24/94* (2013.01); *H01L 2224/13147* (2013.01);

(Continued)

(58) Field of Classification Search

CPC ....................................................... H01L 24/20

See application file for complete search history.

(56) References Cited

U.S. PATENT DOCUMENTS 5,904,565 A * 5/1999 Nguyen ............ H01L 21/76807 257/E21.582
6,259,160 B1 * 7/2001 Lopatin ............... H01L 23/5329 257/E21.589

(Continued)

FOREIGN PATENT DOCUMENTS

| | | | |
|---|---|---|---|
| CN | 102420107 | B | 12/2013 |
| DE | 10311368 | A1 | 11/2003 |
| TW | 201017848 | A | 5/2010 |

OTHER PUBLICATIONS

International Search Report in corresponding PCT Application No. PCT/US2021/035341, mailed Sep. 2, 2021 (2 pages).
Extended European Search report for T79071EP01.

*Primary Examiner* — William A Harriston
(74) *Attorney, Agent, or Firm* — Yudong Kim; Frank D. Cimino

(57) ABSTRACT

An integrated circuit device (100) and method comprising an IC chip (102) having metal interconnect levels (M1-Mn) including a last copper interconnect level (Mn) and a chip-to-package interconnect (110) overlying and connected to the last copper interconnect level (Mn). The chip-to-package interconnect (110) having a via (112) connected to a first element (306*a*) of the last copper interconnect level (Mn) and a copper conductive structure (118) (e.g., bump copper). The via (112) includes a barrier material (112*a*) and a tungsten fill layer (112*b*), the via coupled between the copper conductive structure (118) and the first element (306*a*).

29 Claims, 10 Drawing Sheets

(51) Int. Cl.
*H01L 23/00* (2006.01)
*H01L 23/532* (2006.01)

(52) U.S. Cl.
CPC ............... *H01L 2224/13655* (2013.01); *H01L 2224/13664* (2013.01); *H01L 2224/14505* (2013.01); *H01L 2224/2101* (2013.01); *H01L 2224/215* (2013.01)

(56) References Cited

U.S. PATENT DOCUMENTS 6,486,557 B1 * 11/2002 Davis ................ H01L 23/53228 257/E23.161
6,831,003 B1 * 12/2004 Huang .............. H01L 21/76844 438/653
7,439,170 B1 10/2008 Daubenspeck et al.
8,610,283 B2 * 12/2013 Farooq .............. H01L 21/02697 257/E21.585
9,093,383 B1 * 7/2015 Chopin .................... C08K 3/28
9,196,529 B2 11/2015 Chen
9,716,066 B2 7/2017 Lee
11,387,168 B2 * 7/2022 Yang ................. H01L 23/53295
2003/0207561 A1 * 11/2003 Dubin ............... H01L 21/76843 257/E21.174
2003/0232496 A1 12/2003 Koo
2004/0082164 A1 * 4/2004 Chen ................. H01L 21/76807 438/634
2004/0147104 A1 * 7/2004 Lin ................... H01L 21/76877 257/E21.585
2005/0260842 A1 11/2005 Kaltalioglu
2006/0014320 A1 1/2006 Yamano
2006/0076678 A1 4/2006 Kim et al.
2009/0115058 A1 5/2009 Yu
2011/0026232 A1 * 2/2011 Lin ................... H01L 21/76898 361/760
2011/0204510 A1 8/2011 Lin et al.
2012/0326324 A1 * 12/2012 Lee ....................... H01L 25/105 257/774
2013/0140688 A1 * 6/2013 Chen ................. H01L 21/76898 257/737
2013/0252416 A1 * 9/2013 Takeda .................. H01L 23/481 438/630
2015/0001712 A1 * 1/2015 Daubenspeck ......... H01L 24/11 257/738
2015/0014844 A1 * 1/2015 Wu ................... H01L 23/49805 257/737
2015/0200166 A1 * 7/2015 Kono .................... H01L 23/562 257/529
2015/0262866 A1 9/2015 Meyer et al.
2016/0049384 A1 * 2/2016 Lu ....................... H01L 21/8221 257/737
2017/0125341 A1 * 5/2017 Lin ................... H01L 21/76898
2018/0040585 A1 * 2/2018 Yu ........................... H01L 24/17
2019/0164920 A1 * 5/2019 Tsao ........................ H01L 24/16
2020/0294970 A1 * 9/2020 Uh .......................... H01L 24/11
2021/0066191 A1 * 3/2021 Chen ................... H01L 25/0657
2021/0335713 A1 * 10/2021 Huang .................. H01L 23/481

* cited by examiner

IC DEVICE WITH CHIP TO PACKAGE INTERCONNECTS FROM A COPPER METAL INTERCONNECT LEVEL

CROSS-REFERENCE TO RELATED APPLICATION(S)

This application claims priority to U.S. Provisional Application No. 63/033,247, filed Jun. 2, 2020, which is incorporated herein by reference in its entirety.

FIELD OF THE INVENTION

The invention is generally related to the field of integrated circuit devices and more specifically to integrated circuit devices having copper interconnect levels.

BACKGROUND OF THE INVENTION

Integrated circuits are formed on chips or die of a semiconductor wafer, such as silicon. Each integrated circuit chip typically includes multiple aluminum interconnect levels to interconnect elements of the integrated circuit with each other and provide connections external to the chip. The chips are then assembly packaged using one of a number of different packaging techniques. In order to package the chip, chip-to-package interconnects are formed that vary depending on the packaging technique used. Chip-to-package interconnects can include wire-bonds, solder bumps, copper pillar, and others. The chip-to-package interconnects connect the top or last metal interconnect level of the chip to, for example, another IC chip or device within the same package or an external pin (such as through a lead frame).

SUMMARY OF THE INVENTION

An integrated circuit device and method comprising an IC chip having metal interconnect levels (M1-Mn) including a last copper interconnect level Mn and a chip-to-package interconnect overlying and connected to the last copper interconnect level Mn. The chip-to-package interconnect having a via connected to a first element of the last copper interconnect level Mn and a copper conductive structure (e.g., bump copper). The via includes a barrier material and a tungsten fill layer, the via coupled between the copper conductive structure and the first element.

DETAILED DESCRIPTION OF THE EMBODIMENTS

The embodiments will now be described in conjunction with chip-to-package interconnects for an integrated circuit device having a top/last interconnect level formed by a damascene copper process. While especially beneficial for analog power devices with increased current density requirements, the embodiments below are also suitable for other devices such as low power digital devices (sometimes referred to as advanced CMOS).

Figure 1:
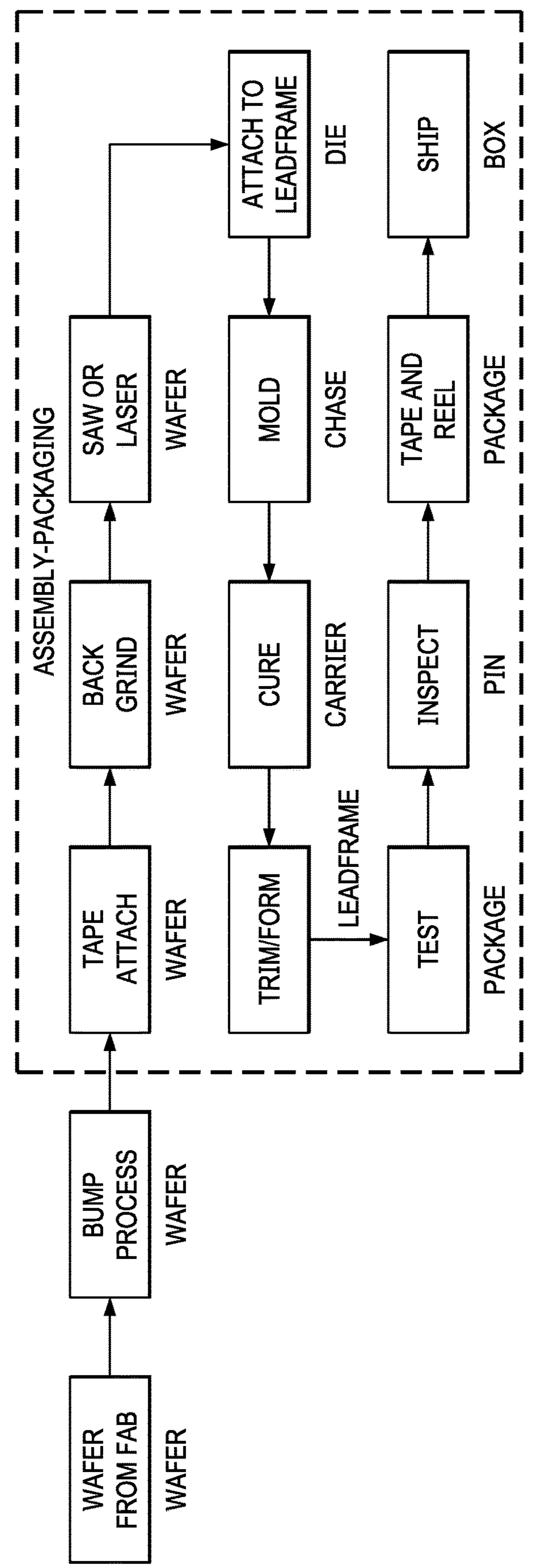
FIG. 1 is a flow diagram of a wafer fab to assembly-packaging of an IC device.

As used herein, integrated circuit device (IC device) refers to an integrated circuit chip that has been assembly-packaged. One exemplary process is shown in FIG. 1. Once an integrated circuit chip is fabricated on a semiconductor wafer in a semiconductor fabrication facility (Fab), Bump processing may be performed, and then the wafer may be transferred to an Assembly-Test site for assembly-packaging. In some cases, one site may contain both the bump operations and assembly-packaging or both the Fab and bump operations. Typical assembly-packaging steps include backgrind, singulation (laser or mechanical saw), attach to lead frame, mold, trim/form of the leads from the lead frame, and test before shipping. Other suitable assembly-packaging processes, such as wafer chip scale packaging, are known in the art and may alternatively be used with the chip-to-package interconnect embodiments discussed herein.

An overview of an integrated circuit device 100 according to an embodiment will now be discussed with reference to FIG. 2. Further details are discussed hereinbelow with reference to FIG. 3A-3F. An integrated circuit chip 102 is fabricated. Transistors and other devices (not shown) are formed in or on the substrate 104. A first metal interconnect level M1 is formed over the substrate. Additional metal interconnect levels M2 thru Mn are also formed. Metal interconnect level Mn comprises copper and may be formed using a copper damascene process. Metal interconnect levels M1 thru Mn−1 may comprise copper (predominantly copper) or aluminum (predominantly aluminum). Metal interconnect levels M1-Mn are used to interconnect the transistors and other devices to each other. The last metal interconnect level Mn is also used to make connections external to the chip 102. Especially in analog devices, the last metal interconnect level Mn may be thicker than the lower metal interconnect levels M1 through Mn−1. For example, Mn may have a thickness in the range of 0.2 μm to 6 μm. A passivation layer/protective overcoat 106 is formed on the last metal interconnect level Mn. As an example, passivation layer 106 may include a layer of silicon dioxide 106*a* and a layer of silicon nitride or silicon oxynitride 106*b*.

Next, chip-to-package interconnects 110 are formed. This is sometimes referred to as BUMP processing and may occur in a BUMP facility separate from the Fab. Vias 112 and probe contact areas 114 are formed through the passivation layer 106 to elements of the last metal interconnect level Mn. The vias 112 comprise a tungsten fill layer 112*b*. Vias 112 may also include a barrier layer 112*a*. The barrier layer 112*a* may, for example be TaN or a stack of TiN on Ti on TaN (TaN/Ti/TiN stack). Other examples include stacks of Ta/TaN, TaN/TiN, and Ta/TaN/Ti/TiN (where the materials of the stack are listed from bottom to top). The barrier layer prevents interaction between the tungsten fill 112*b* and the copper of metallization level Mn.

Probe contact areas 114 are used for testing and are wide enough to allow for contact by a probe of a probe card. Probe pads are typically located in a scribe area of a wafer but may also include probe contact areas such as 114 within the IC chip 102. Probe contact area 114 is significantly wider than vias 112 to allow contact by the probe. As such, the tungsten fill layer 112*b* does not fill probe contact area 114 as it does vias 112. Probe contact area 114 also includes probe metal stack 116 on tungsten layer 112*b*. Probe metal stack 116 is not located in or on vias 112. Probe metal stack 116 comprises a material that provides a structurally appropriate surface for probing. For example, probe metal stack 116 may include a palladium Pd layer on a layer of nickel Ni. Probe metal stack 116 may further include a layer of TaN or other barrier layer under the Ni layer.

A conductive copper structure 118 is formed on the vias 112 but not the probe contact areas 114. Conductive copper structure 118 may, in some cases, be referred to as bump copper. In the case of bump copper, the thickness of conductive copper structure 118 is significantly thicker than fab metal such as Mn and the conductive copper structure 118 may have a thickness in the range of 3 μm to 25 μm thick copper interconnects or 25 μm to 100 μm tall copper pillars. One or more vias 112 connect each conductive copper structure 118 to an element of the last metal interconnect level Mn.

After formation of copper structure 118, further assembly package operations are conducted. These operations may be performed in a separate assembly/test (A/T) facility. These may include placement of solder balls in WCSP processes or attachment to a lead frame or other IC device, singulation, mold, backgrind, test, tape and reel. In one example, the IC chip 102 may then attached to structure 122. The IC chip 102 may be flipped with structure 122 being leads of a lead frame. Alternatively or additionally, structures 122 may be contacts to one or more other IC chips. In addition, the means of attachment will vary depending on the packaging technology utilized. FIG. 2 illustrates a solder connection 120 between the conductive copper structure 118 and structures 122. Mold 130 is then applied to the integrated circuit chip 102, chip-to-package interconnects 110, and structures 122.

Figure 3A:
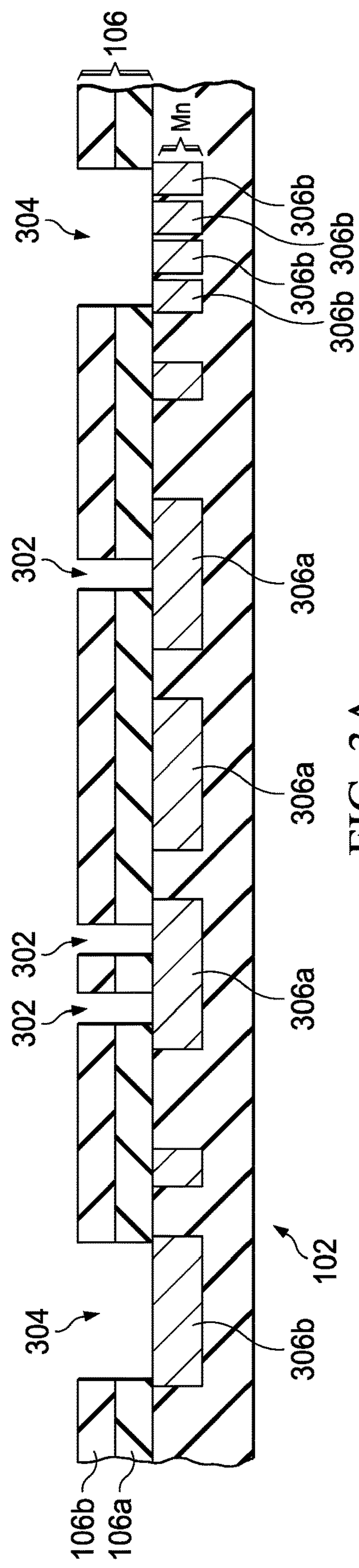
FIG. 3A-3F are cross-sectional diagrams of an IC device at various stages of IC manufacturing according to an embodiment.

A more detailed process for forming the chip-to-package interconnects 110 with tungsten vias will now be discussed with reference to FIGS. 3A-3F. FIG. 3A shows the integrated circuit chip 102 after first openings 302 and second openings 304 have been formed through the passivation layer 106 to last metallization level Mn. Integrated circuit chip 102 has completed semiconductor fabrication, meaning the last metallization level Mn has been formed and coated with passivation layer 106. Last metallization level Mn comprises copper rather than aluminum as in prior art analog devices. Last metallization level Mn includes first elements 306*a* for electrical connection external to/from IC chip 102 in a final IC Device and second elements 306*b* for probe access during testing. Passivation layer may include a layer of silicon dioxide 106*a* and a layer of silicon nitride or silicon oxynitride 106*b*.

First openings 302 are narrower via-sized openings and second openings 304 are wider, probe pad sized openings. As an example, first openings 302 may have a width in the range of 0.1 μm to 1.5 μm and second openings 304 may have a width in the range of 8 μm to 120 μm. First openings 302 overlie/expose first elements 306*a* and second openings 304 overlie/expose second elements 306*b*.

Figure 3B:
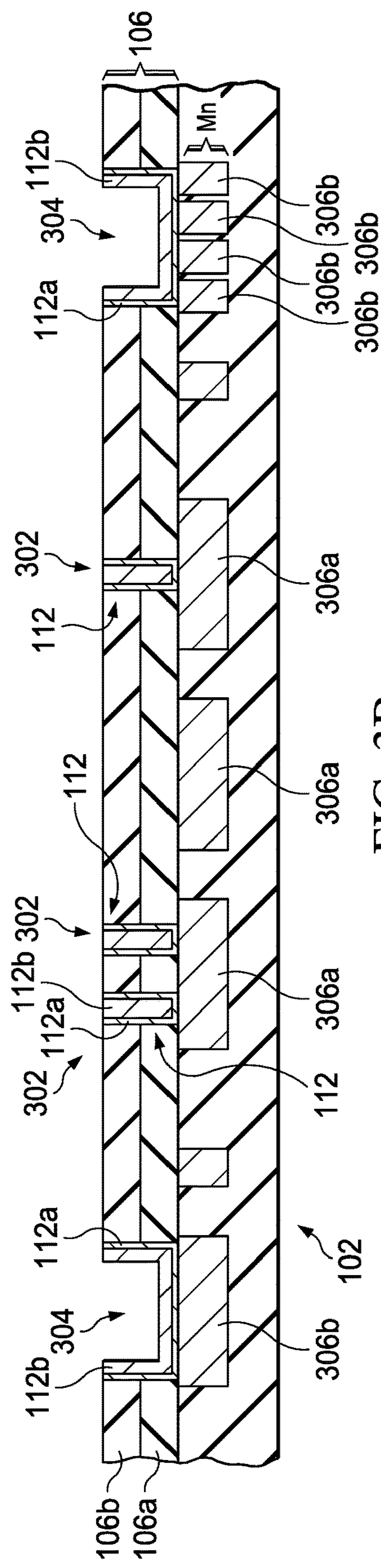
Figure 3C:
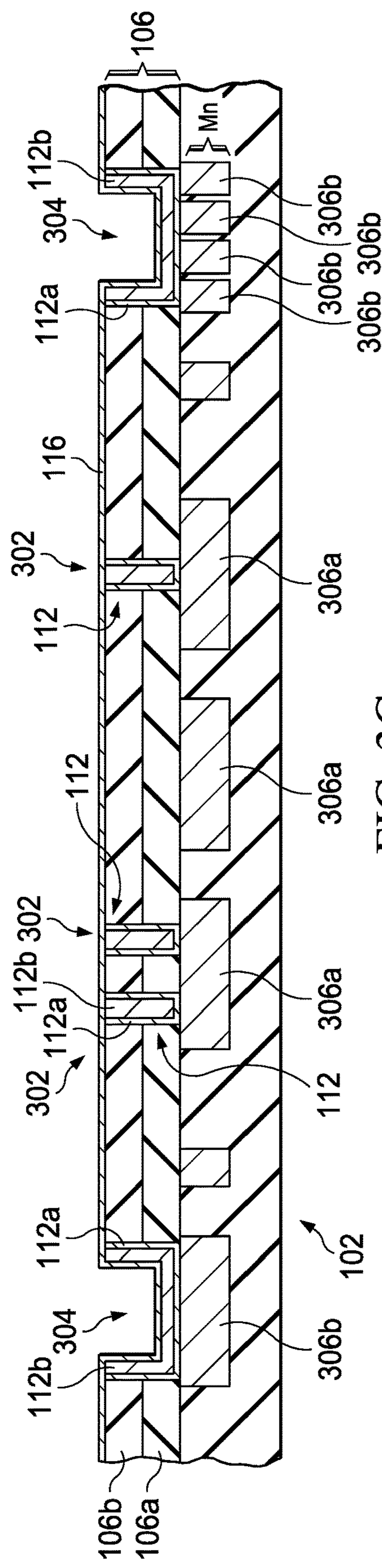

FIG. 3B illustrates the IC chip 102 after formation of vias 112. Vias 112 may be formed by depositing a conductive barrier layer 112*a* over passivation layer 106 and within first openings 302 and second openings 304, such that barrier layer 112*a* lines the sidewalls and bottom of first openings 302 and second openings 304. Barrier layer 112*a* may, for example, comprise TaN. Alternatively, barrier 112*a* may comprise TiN on Ti on TaN on Ta. Other examples include stacks of Ta/TaN, TaN/TiN, and TaN/Ti/TiN (where the materials of the stack are listed from bottom to top). The purpose of barrier layer 112*a* is to block diffusion of underlying copper and allow good adhesion to tungsten which is deposited over it. Then, tungsten 112*b* is deposited over barrier layer 112*a* including in first openings 302 and second openings 304. Tungsten is deposited to a thickness that fills first openings 302 but because second openings 304 are significantly wider than first openings 302, tungsten does not fill second openings 304. As shown in FIG. 3B, tungsten 112*b* may, along with barrier 112*a*, line the sidewalls and bottom of second openings 304. Chemical-mechanical-polishing (CMP) is then performed to remove barrier layer 112*a* and 112*b* from the surface of passivation layer 106, leaving filled vias 112.

After forming filled vias 112, a probe metal/metal stack 116 is deposited over passivation layer 106 and filled vias 112, as shown in FIG. 3B. Probe metal stack 116 is also deposited in second openings 304. Because vias 112 are completely filled, the probe metal stack 116 does not extend into first openings 302. Probe metal stack 116 comprises a metal that is appropriate for probing without causing extensive wear on a probe card used for probing. One suitable example is Pd on Ni. In another suitable example, a stack of Pd on Ni on TaN. Other examples include Pd on Ni on TaN on Ta, or aluminum.

Figure 3D:
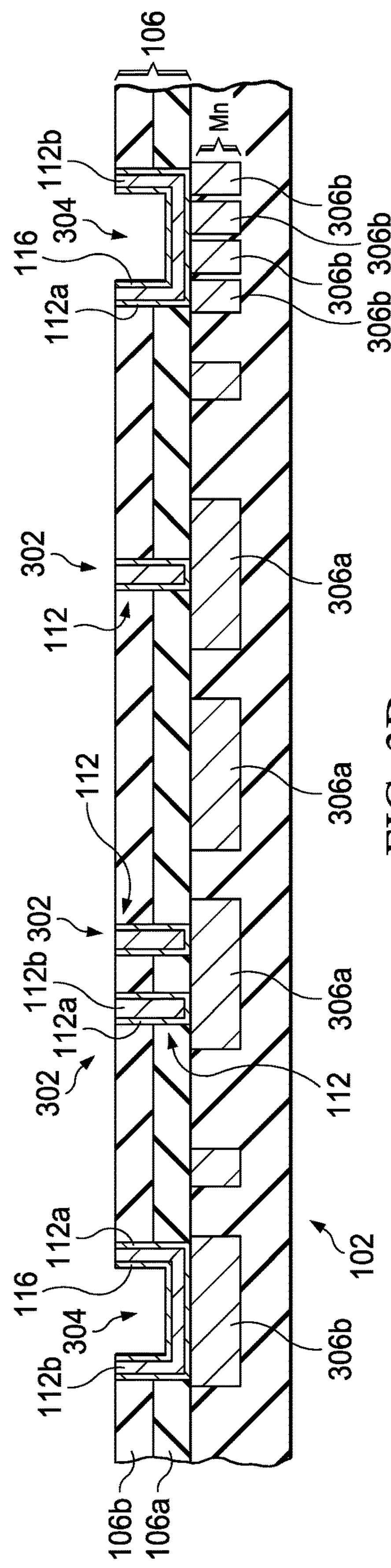

A second CMP is performed on the probe metal stack 116 to remove the probe metal stack from over the passivation layer 106 and vias 112 while leaving the probe metal stack 116 over the tungsten 112*b* and barrier 112*a* on the sidewalls and bottom of second openings 304, as shown in FIG. 3D.

Because the last metallization level Mn comprises copper rather than aluminum, several challenges are presented when it comes to probing the IC chip 102. Unlike aluminum, copper oxidizes when exposed to the ambient such as that required for probing. This is especially problematic during a data retention bake where the IC chip is probed then baked for a given time and then probed again. Thus, it is undesirable to have copper exposed during probe and/or to probe between forming the openings in the passivation layer and filling the vias. Using a tungsten plug for probing causes extensive probe card wear making its use in production undesirable. Using other materials, suitable for probing, to fill the openings over copper Mn, such as physical vapor deposition (PVD) aluminum or PVD Ni/Pd, leaves voids when filling narrow vias.

Accordingly, the embodiments disclosed herein make use of narrower and wider openings in the passivation layer to balance the competing requirements of probe and forming efficient chip-to package interconnects to provide different surfaces for the narrower first openings 302 (tungsten) and wider second openings 304 (Pd).

Figure 3E:
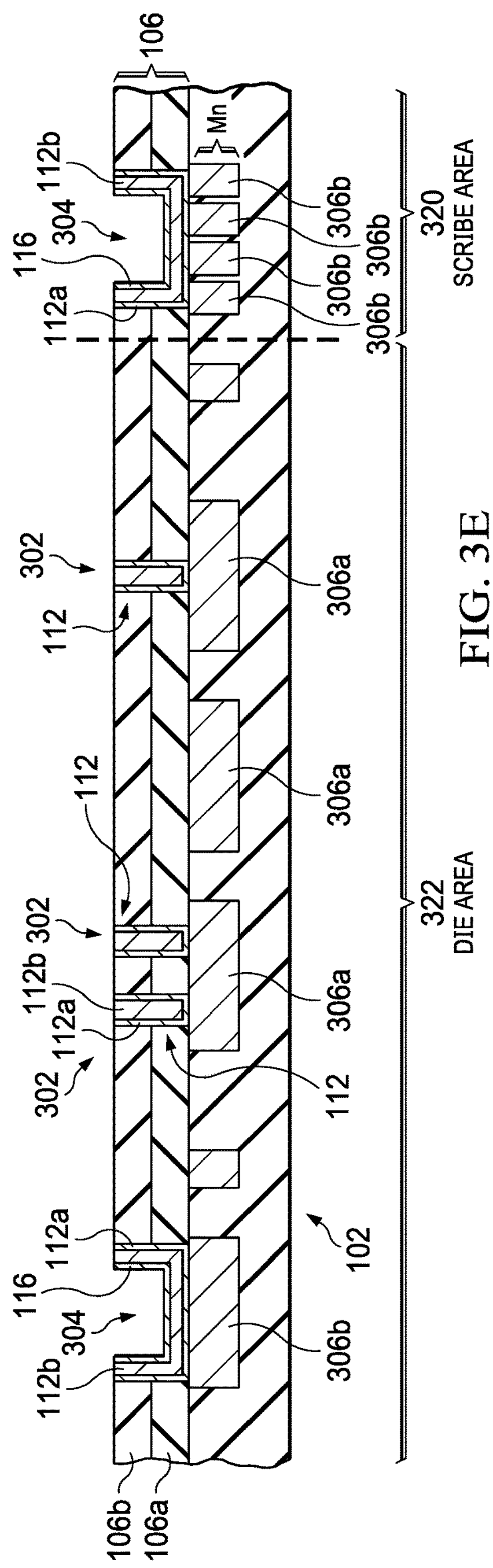

After the second CMP, the IC chip 102 may be probed. FIG. 3E shows a second opening 304 in the scribe area 320. Scribe areas are where the IC chip 102 is singulated or separated from other IC chips on the wafer. This is where the saw or laser passes during assembly-packaging. While various test structures may be formed in the scribe areas, the functional circuitry and associated interconnect of the IC chip is located in the die area 322. Second openings 304 may optionally also be formed in the die area 322 as shown in FIG. 3E and remain part of the finished IC device.

Figure 3F:
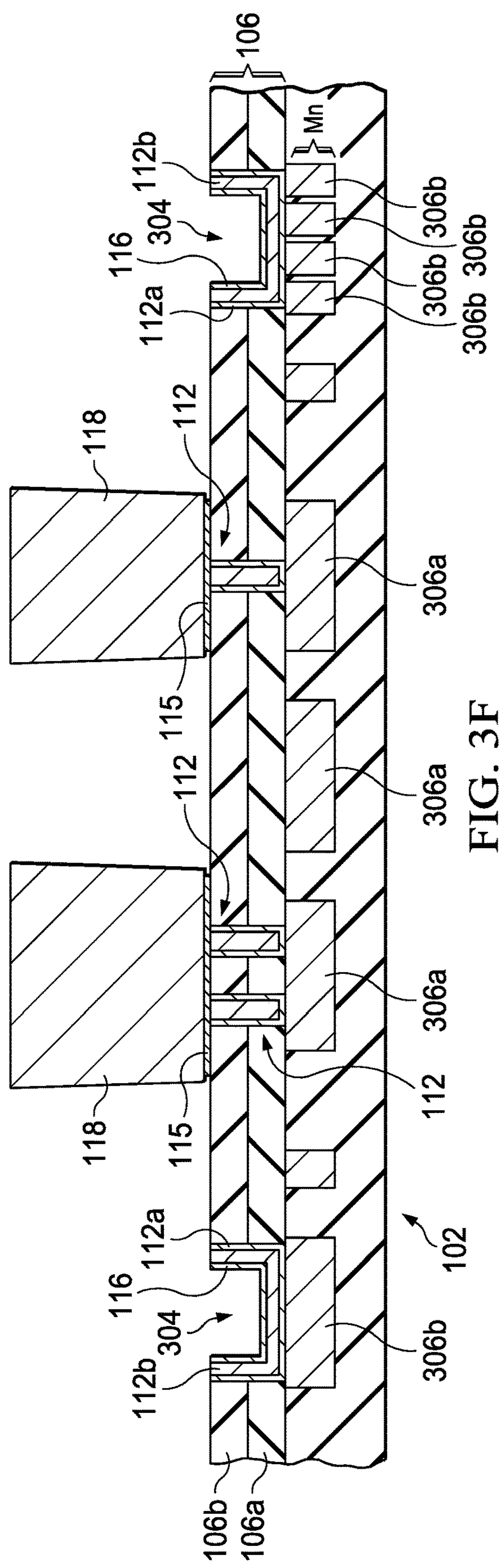

Referring to FIG. 3F, copper conductive structures 118 are formed over vias 112. A barrier layer 115 may be formed over the vias prior to forming the copper conductive structures 118. Barrier layer 115 may, for example, comprises TiW or Ti. Conductive structures 118 may be formed by forming a pattern and electroplating copper in openings in the pattern. Vias 112 electrically connect between copper conductive structures 118 and first elements 306*a* of last metallization level Mn. Copper conductive structures 118 may sometimes be referred to as bump copper and may take many forms as discussed below with reference to FIGS. 4 through 9.

After forming copper conductive structures 118, IC device may be completed by performing the desired assembly packaging steps on IC chip 102. Several different chip-to-package interconnects and assembly packaging options are discussed below with respect to FIGS. 4-9.

Figure 2:
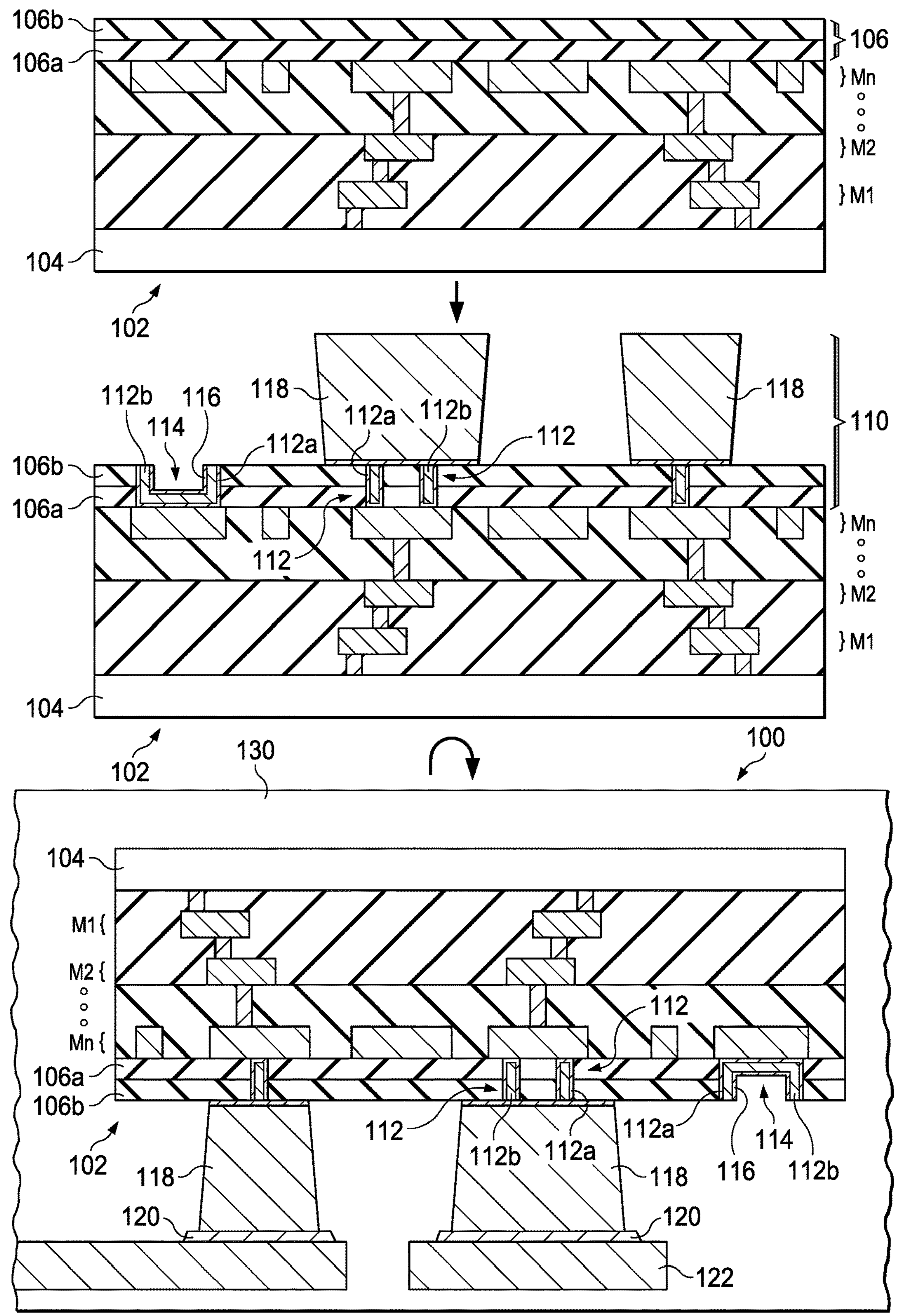
FIG. 2 is a cross-sectional diagram of an IC chip to IC device according to an embodiment.
Figure 4:
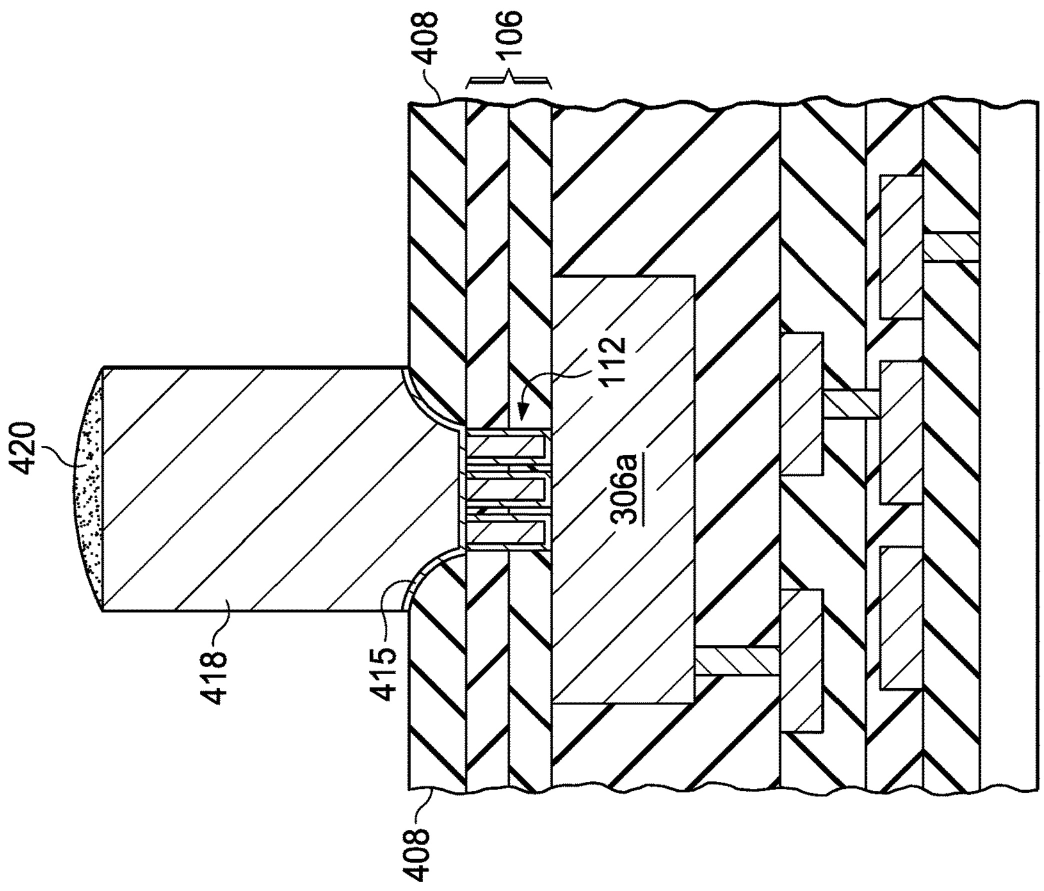

FIG. 4 illustrates IC chip 402 with bump processing in the form of a copper pillar 418 (as copper conductive structure 118 of FIG. 2). As in the other embodiments, IC chip 402 includes first element 306*a* and vias 112 through passivation layer 106. A protective dielectric layer 408 is formed over passivation layer 106 and vias 112. For example, protective dielectric layer 408 comprises polyimide. Other polymers such as polybenzoxazole (PBO) or bisbenzocyclobutene (BCB) may alternatively be used.

An opening is formed through protective dielectric layer 408 to expose the tops of vias 112. A barrier layer 415 is formed over the protective layer 408 including within the opening so as to contact the tops of vias 112. Barrier layer 415 may comprise TiW or Ti, for example. Bump copper processing is formed on the barrier layer 415 to form a thick copper pillar 418. Copper pillar 418 is significantly thicker than first element 306*a* (Mn) and may have a thickness in the range of 25 μm to 100 μm versus 0.1 μm to 6 μm for first element 306*a*. Adhesive 420, such as solder, is formed on the surface of copper pillar 418. The IC chip 402 is then transferred to assembly-packaging where adhesive 420 may be used to connect copper pillar 418 to leads of a lead frame or to another IC chip after singulation (similar to that discussed above relative to FIG. 2) and formation of the IC device may be completed.

Figure 5:
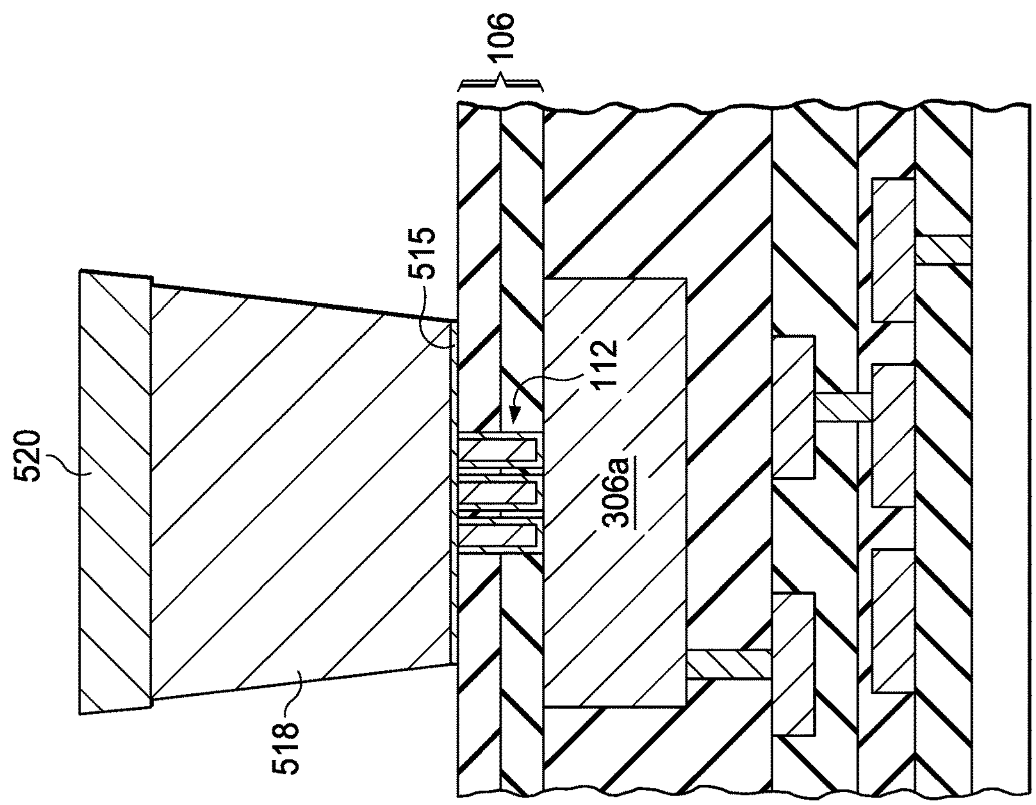
FIG. 4-9 are cross-sectional diagrams of IC devices according to various embodiments.

FIG. 5 illustrates IC chip 502 with bump processing in the form of a copper conductive structure 518 with an overlying metal 520. Metal 520 may be referred to as a wire bond metal stack or a probe metal stack and may comprise a stack of Ni/Pd or alternatives such as Ni/Au or Ni/Pd/Au or aluminum. A barrier layer 515 is formed over the protective layer 106 so as to contact the tops of vias 112. Barrier layer 515 may comprise TiW or Ti, for example. Bump copper processing is formed on the barrier layer 515 to form a thick copper conductive structure 518. Copper structure 518 is significantly thicker than first element 306*a* (Mn) and may have a thickness in the range of 3 μm to 25 μm. Metal 520 (e.g., Ni/Pd) is formed on the copper structure 518. The IC chip 502 is then transferred to assembly-packaging where the IC chip 502 is wirebonded and singulated, mold compound is applied, and formation of the IC device may be completed.

Figure 6:
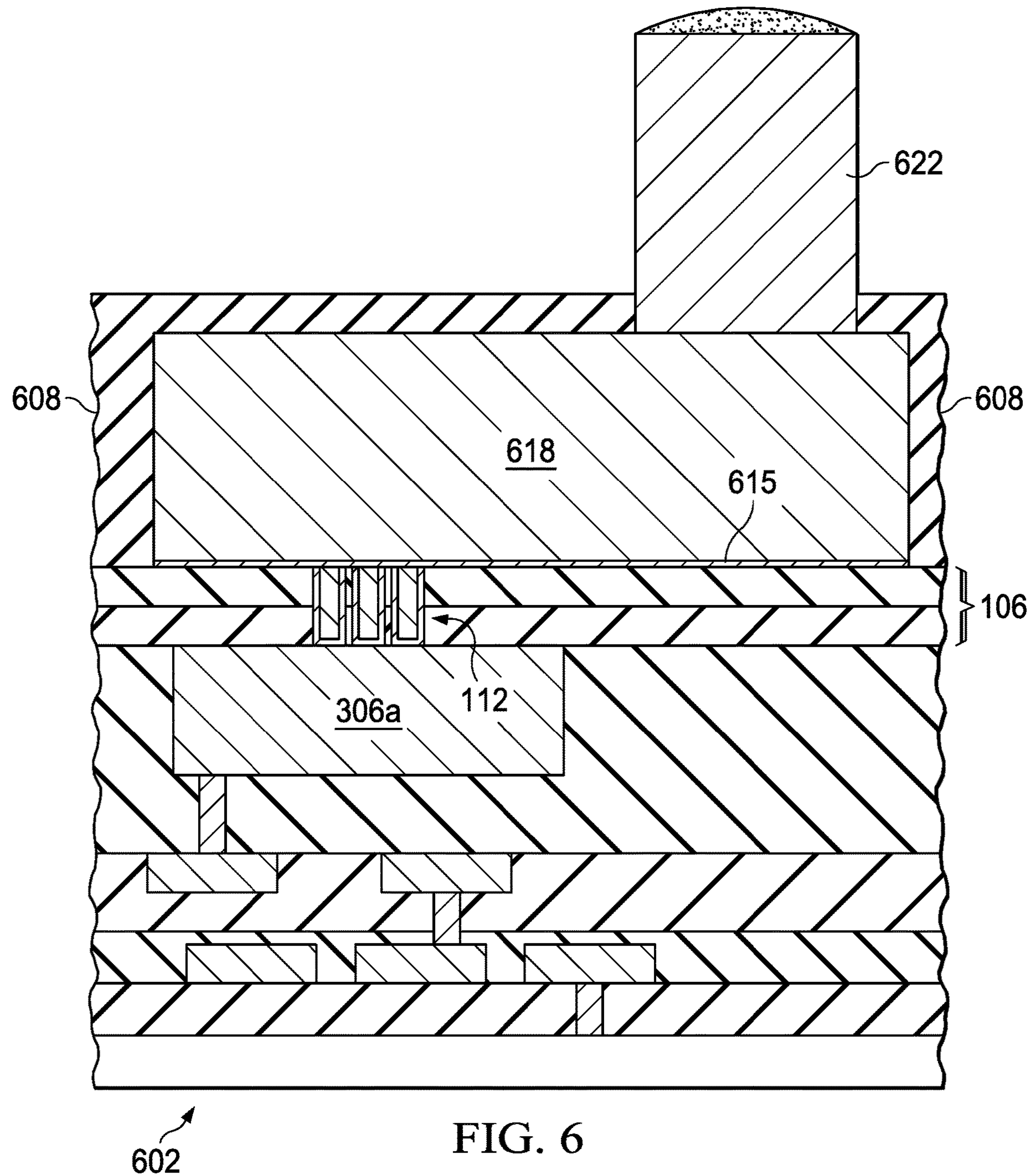

FIG. 6 illustrates IC chip 602 with bump processing in the form of a first copper conductive structure 618 and a copper post 622. A barrier layer 615 is formed over the protective layer 106 so as to contact the tops of vias 112. Barrier layer 615 may comprise TiW or Ti, for example. Copper conductive structure 618 is formed on barrier layer 615. Copper structure 618 is thicker than first element 306*a* (Mn) and may have a thickness in the range of 3 μm to 25 μm. Next, a protective dielectric layer 608, such as polyimide, is formed over the IC chip 602. An opening is formed in protective dielectric layer 608 and a copper post 622 is formed in the opening. The IC chip 602 may then be singulated, for example in an assembly-packaging facility. The copper post 622 is attached to a leadframe and molding is applied to the IC chip 602.

Figure 7:
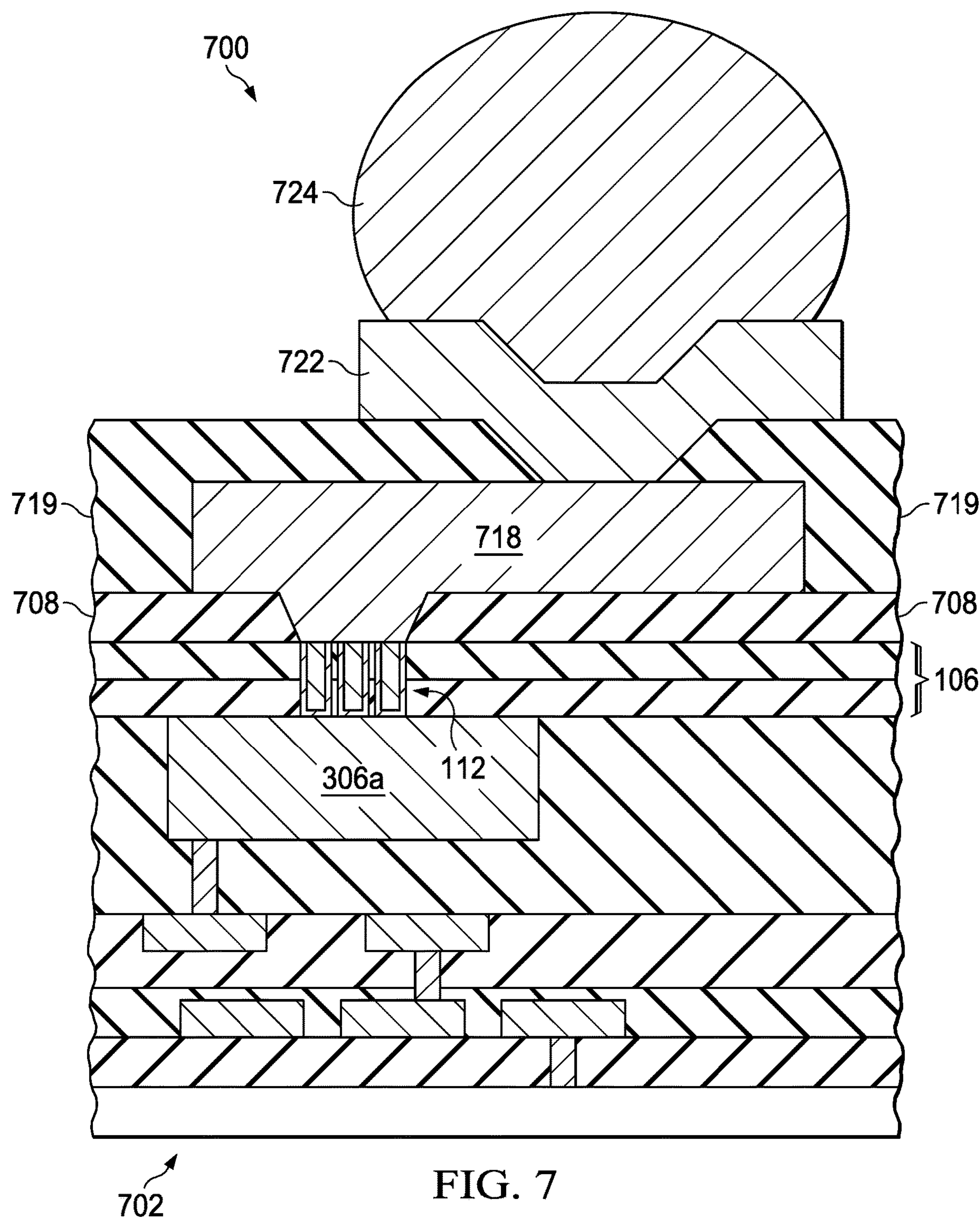

FIG. 7 illustrates IC chip 702 with further processing in the form of a copper redistribution layer 718 (as copper conductive structure 118 of FIG. 2) and an under-bump metallization (UBM) layer 722 upon which a solder ball 724 is placed. Packaging of IC device 700 may be referred to as a WCSP where the solder ball 724 is exposed for attachment of the completed IC device 700 to, for example, a printed circuit board as desired by a customer. A first, optional, protective dielectric layer 708, such a polyimide, is formed over IC chip 702. An opening is formed in protective dielectric layer 708 if present, and a copper redistribution layer (RDL) 718 is formed over the first protective dielectric layer 708 including within the opening. RDL layer 718 makes electrical contact through vias 112 to first element 306*a* of Mn. A second protective dielectric layer 719, such as polyimide, is formed over the copper RDL 718. An opening is formed in the second protective layer 719 and UBM layer 722 is formed over the second protective layer 719 including within the opening. The above steps may be performed in a bump facility. After placing the solder ball 724 in the opening, the IC chip 702 is singulated.

Figure 8:
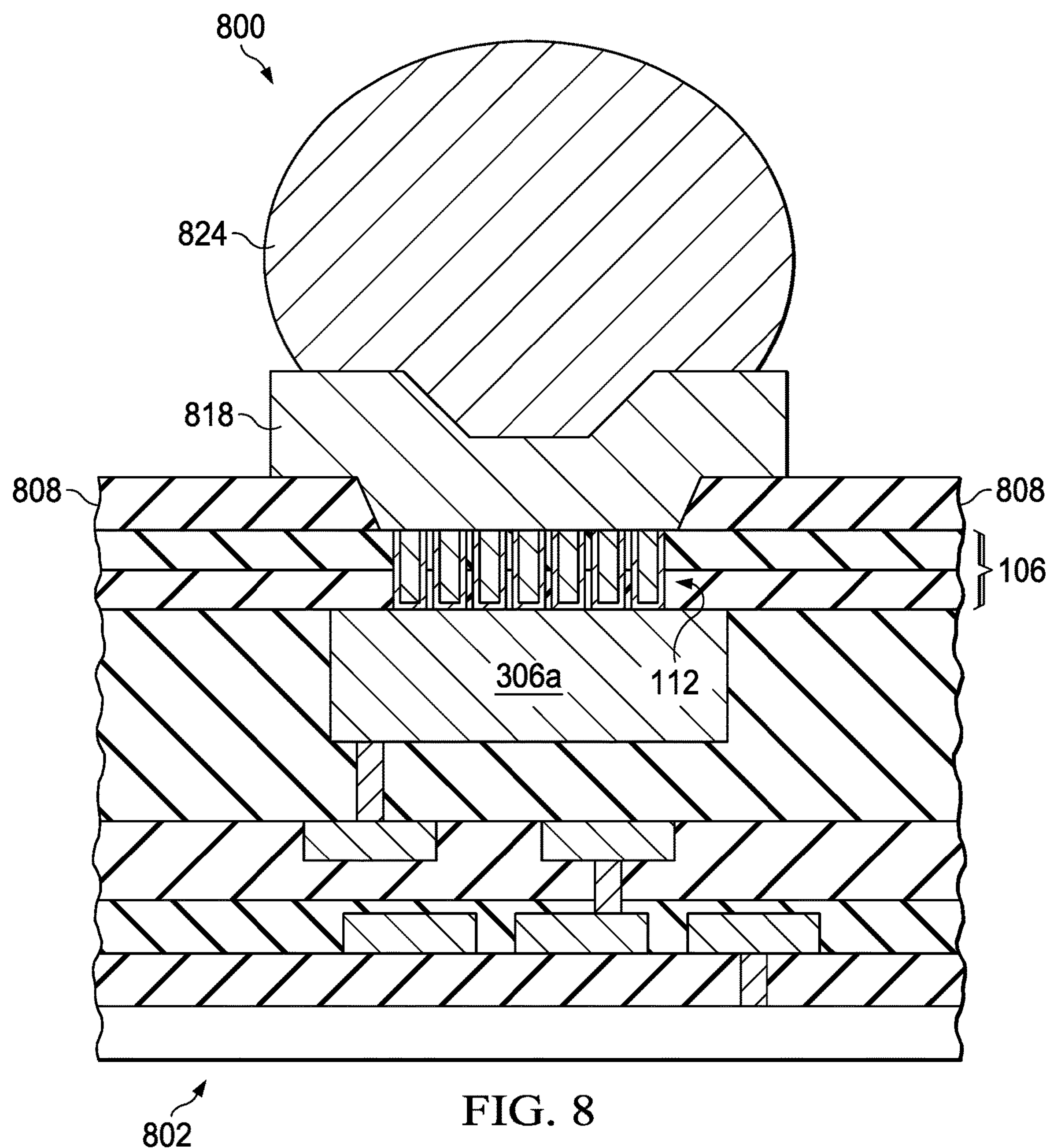

FIG. 8 illustrates another wafer chip scale type of IC device 800 where the copper conductive structure 118 takes the form of an UBM layer 818. IC chip 802 is further processed by applying a protective layer 808 such as polyimide, forming an opening in the protective layer 808 to expose the tops of vias 112, forming copper UBM layer 818 over the protective layer 808, including within the opening to contact vias 112, and forming solder ball 824 on copper UBM layer 818. UBM layer 818 makes electrical contact through vias 112 to first element 306*a*. After placing the solder ball 824, the IC chip 802 is singulated.

Figure 9:
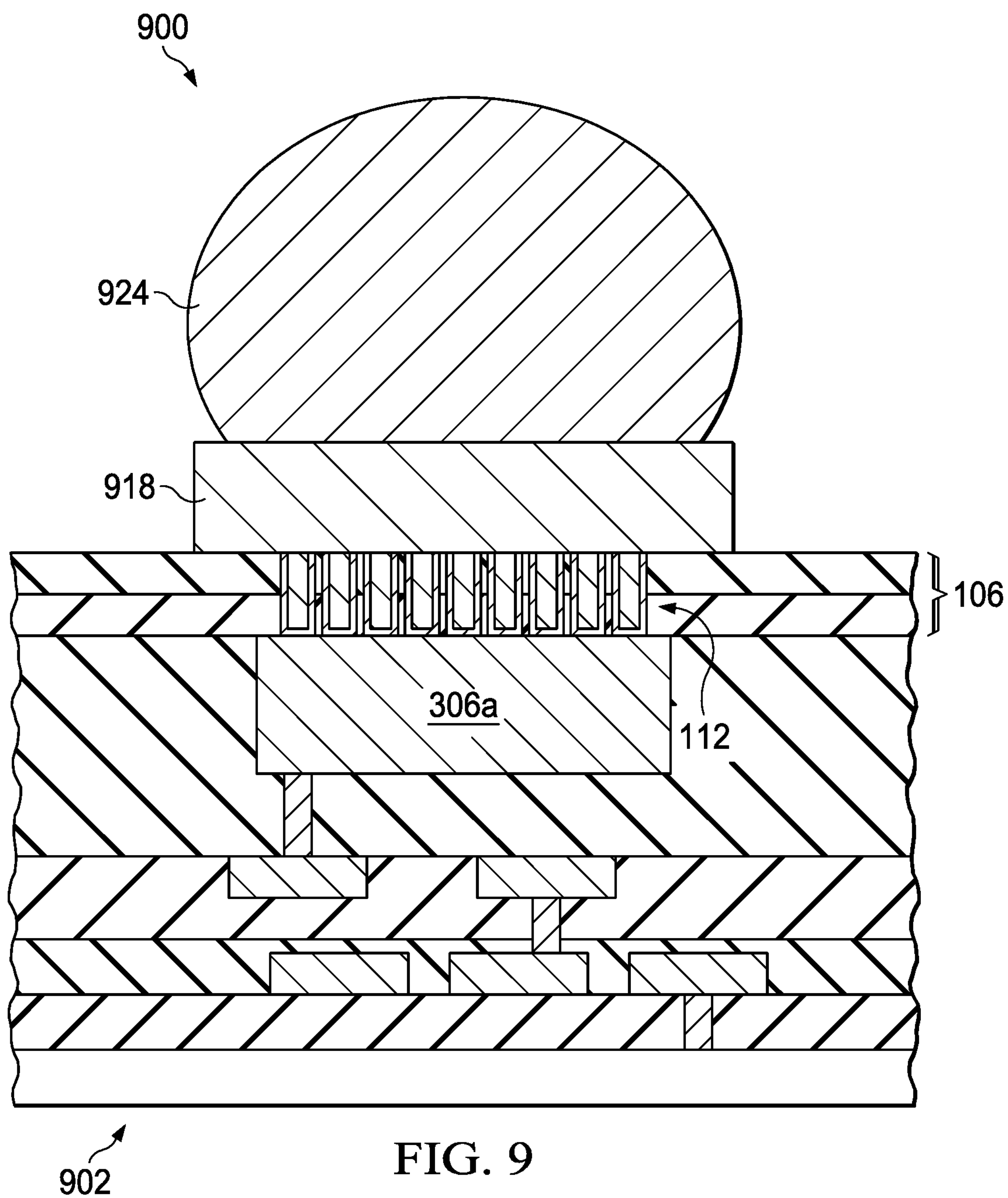

FIG. 9 illustrates another wafer chip scale type of IC device 900 where the copper conductive structure 118 takes the form of an UBM layer 818. IC chip 902 is further processed by forming copper UBM layer 918 over passivation layer 106 and forming solder ball 924 on UBM layer 918. Copper UBM layer 918 makes electrical contact through vias 112 to first element 306*a*. After placing the solder ball 924, the IC chip 902 is singulated.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. An integrated circuit device comprising:

a chip having metal interconnect levels including a last copper interconnect level; and a chip-to-package interconnect overlying and connected to the last copper interconnect level, the chip-to-package interconnect having:

a via connected to a first element of the last copper interconnect level, the via having a barrier material at a sidewall and extended across a bottom of the via, wherein tungsten fills a remaining space in the via; and a copper conductive structure, the via coupled between the copper conductive structure and the first element.

2. The integrated circuit device of claim 1, wherein the copper conductive structure is an under-bump metal structure and the chip-to-package interconnect further comprises a solder bump on the under-bump metal structure.

3. The integrated circuit device of claim 1, wherein the copper conductive structure is a copper pillar.

4. The integrated circuit device of claim 1, wherein the copper conductive structure is a copper structure with an overlying Ni/Pd layer.

5. The integrated circuit device of claim 1, wherein the copper conductive structure includes:

a copper structure extending over the first element and a portion of the chip adjacent the first element; and a copper post overlying and connected to the copper structure, the copper post offset from the first element.

6. The integrated circuit device of claim 1, wherein the copper conductive structure includes a copper structure extending over the first element and a portion of the chip adjacent the first element and the chip-to-package interconnect further comprises:

an under-bump metal structure offset from the first element; and a solder bump over the under-bump metal structure.

7. The integrated circuit device of claim 1, wherein the via extends through a passivation layer.

8. The integrated circuit device of claim 7, wherein the passivation layer comprises a layer of silicon nitride over a layer of oxide.

9. The integrated circuit device of claim 7, wherein the passivation layer comprises a layer of silicon oxynitride over a layer of oxide.

10. The integrated circuit device of claim 1, wherein the via comprises one or more vias connected between the first element and the copper conductive structure.

11. The integrated circuit device of claim 1, further comprising:

a barrier layer disposed between the via and the copper conductive structure, the barrier layer including TiW or Ti.

12. The integrated circuit device of claim 1, further comprising:

a protective dielectric layer disposed between the via and the copper conductive structure, the protective dielectric layer including an opening, wherein the via couples to the copper conductive structure through the opening.

13. The integrated circuit device of claim 12, wherein the protective dielectric layer includes polyimide, polybenzoxazole (PBO), or bisbenzocyclobutene (BCB).

14. The integrated circuit device of claim 1, wherein the copper conductive structure includes a redistribution layer, the integrated circuit device further comprising:

a polyimide layer over the redistribution layer;

an under-bump metal structure connected to the redistribution layer through an opening in the polyimide layer; and a solder bump on the under-bump metal structure.

15. The integrated circuit device of claim 1, further comprising:

a probe contact area connected to a second element of the last copper interconnect level, the probe contact area including the barrier material at a sidewall and a bottom of the probe contact area and the tungsten on the barrier material.

16. The integrated circuit device of claim 15, wherein the probe contact area further includes a probe metal stack on the tungsten.

17. The integrated circuit device of claim 16, wherein the probe metal stack includes a layer of Ni and a layer of Pd.

18. The integrated circuit device of claim 1, wherein the via has a first width at the bottom and a second width at a top of the via, the second width substantially same as the first width.

19. A method of fabricating an integrated circuit device, comprising:

forming a last metal interconnect level of an integrated circuit chip using a damascene copper process;

depositing a passivation layer over the last metal interconnect level;

forming chip-to-package interconnects by:

forming first openings and second openings in the passivation layer, the second openings being wider than the first openings;

depositing a barrier layer over the passivation layer and into the first openings and second openings;

depositing tungsten over the barrier layer, the tungsten filling the first openings and lining without filling the second openings;

removing the tungsten and the barrier layer from over the passivation layer by chemical-mechanical polishing, leaving the tungsten and barrier layer in the first and second openings;

depositing a probe metal stack over the passivation layer and first openings, the probe metal stack extending into the second openings but not the first openings;

removing the probe metal stack from over the passivation layer and the first openings, leaving the probe metal stack in the second openings; and forming copper conductive structures over the first openings, each copper conductive structure being electrically coupled to the last metal interconnect level by the tungsten in the first openings.

20. The method of claim 19, wherein the probe metal stack includes a layer of Ni and a layer of Pd.

21. The method of claim 20, wherein the barrier layer includes Ti, TiN, Ta, TaN, or a combination thereof.

22. The method of claim 19, further comprising probing the integrated circuit chip by contacting the probe metal stack in at least some of the second openings.

23. The method of claim 19, wherein the copper conductive structures are copper bumps.

24. The method of claim 19, wherein the copper conductive structures are under-bump metal structures underlying a solder bump.

25. The method of claim 19, wherein the copper conductive structures are copper pillars.

26. The method of claim 19, wherein the copper conductive structures are redistribution layers and further comprising:

forming a polyimide layer over the redistribution layers;

forming under-bump metal structures through the polyimide layer to the redistribution layers; and forming solder bumps on the under-bump metal structures.

27. The method of claim 19, further comprising:

singulating the integrated circuit chip from other integrated circuit chips on a wafer;

attaching the integrated circuit chip via the chip-to-package interconnects to a lead frame; and applying a mold compound to the integrated circuit chip attached to the lead frame.

28. An integrated circuit device comprising:

a chip having metal interconnect levels including a last copper interconnect level; and a chip-to-package interconnect overlying and connected to the last copper interconnect level, the chip-to-package interconnect having:

a via connected to a first element of the last copper interconnect level, the via having a barrier material at a sidewall and extended across a bottom of the via, wherein tungsten fills a remaining space in the via, and wherein the barrier material includes Ti, TiN, Ta, TaN, or a combination thereof; and a copper conductive structure, the via coupled between the copper conductive structure and the first element.

29. The integrated circuit device of claim 28, wherein the via has a first width at the bottom and a second width at a top of the via, the second width substantially same as the first width.

* * * * *